(12) United States Patent
Zhou et al.

(10) Patent No.: US 10,879,315 B2
(45) Date of Patent: Dec. 29, 2020

(54) PIXEL STRUCTURE AND DISPLAY DEVICE

(71) Applicant: Wuhan China Star Optoelectronics Semiconductor Display Technology Co., Ltd., Wuhan (CN)

(72) Inventors: Xia Zhou, Wuhan (CN); Nian Tian, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/347,819

(22) PCT Filed: Nov. 2, 2018

(86) PCT No.: PCT/CN2018/113551
§ 371 (c)(1),
(2) Date: May 7, 2019

(87) PCT Pub. No.: WO2020/042343
PCT Pub. Date: Mar. 5, 2020

(65) Prior Publication Data
US 2020/0144338 A1    May 7, 2020

(51) Int. Cl.
*G09G 3/3225* (2016.01)
*H01L 27/32* (2006.01)
(52) U.S. Cl.
CPC ....... *H01L 27/3213* (2013.01); *G09G 3/3225* (2013.01); *G09G 2300/0452* (2013.01)

(58) Field of Classification Search
CPC .............. H01L 27/3213; G09G 3/3225; G09G 2300/0452
See application file for complete search history.

(56) References Cited

U.S. PATENT DOCUMENTS

| | | | |
|---|---|---|---|
| 2008/0030660 A1* | 2/2008 | Roth | G09G 3/3607 349/106 |
| 2008/0158097 A1* | 7/2008 | Guo | G09G 5/02 345/55 |
| 2014/0354520 A1* | 12/2014 | Sato | G09G 3/3233 345/77 |
| 2016/0027362 A1* | 1/2016 | Guo | G09G 3/2003 345/690 |
| 2016/0343284 A1* | 11/2016 | Sun | H01L 51/0011 |
| 2018/0197922 A1* | 7/2018 | Song | H01L 51/5203 |
| 2019/0187850 A1* | 6/2019 | Kim | G06F 1/1643 |

* cited by examiner

*Primary Examiner* — Towfiq Elahi

(57) ABSTRACT

The present invention provides a pixel structure and a display device. The pixel structure includes a plurality of first pixels and a plurality of second pixels, and each of the sub-pixels in the first pixels and the second pixels has an octagonal shape. In the first pixels and the second pixels which are alternately arranged in the traverse direction, for two adjacent ones of the first pixels and the second pixels, a first space and a second space are defined between the corresponding sub-pixels, and the first space and the second space are used to assist light emission of the pixel structure.

20 Claims, 3 Drawing Sheets

PIXEL STRUCTURE AND DISPLAY DEVICE

RELATED APPLICATIONS

This application is a National Phase of PCT Patent Application No. PCT/CN2018/113551 having International filing date of Nov. 2, 2018, which claims the benefit of priority of Chinese Patent Application No. 201811001553.3 filed on Aug. 30, 2018. The contents of the above applications are all incorporated by reference as if fully set forth herein in their entirety.

FIELD AND BACKGROUND OF THE INVENTION

The present invention relates to the field of display technologies, and in particular, to a pixel structure and a display device.

An OLED (organic light emitting diode), or an active matrix organic light emitting diode has advantages of fast response, wide viewing angle and flexible display, and thus becomes dominant in the display field.

An OLED display includes a plurality of pixel units. In general, one pixel unit includes three sub-pixels: a red (R) sub-pixel, a green (G) sub-pixel, and a blue (B) sub-pixel. Image display can be achieved by adjusting the above three sub-pixels.

However, the above three sub-pixels have inconsistent luminous efficiencies, reducing the display effect of the OLED. For example, under the same electric current, the luminous efficiency of the blue sub-pixel is much lower than those of the green sub-pixel and the red sub-pixel.

SUMMARY OF THE INVENTION

An object of the present invention is to provide a pixel structure and a display device to improve the luminous efficiency of the pixel structure.

An embodiment of the present invention provides a pixel structure, the pixel structure includes a plurality of first pixels and a plurality of second pixels, wherein the first pixels each include a first sub-pixel and a second sub-pixel arranged in an oblique line, and the second pixels each include the second sub-pixel and a third sub-pixel arranged in an oblique line, wherein each of the first sub-pixel, the second sub-pixel, and the third sub-pixel has an octagonal shape.

The first pixel and the second pixel are alternately arranged in a longitudinal direction, and the first pixel and the second pixel are alternately arranged in a longitudinal direction.

In the first pixels and the second pixels alternately arranged in the traverse direction, for two adjacent ones of the first pixels and the second pixels, a first space is defined between the first sub-pixel corresponding to the adjacent first pixel and the third sub-pixel corresponding to the adjacent second pixel, and a second space is defined between the second sub-pixel corresponding to the adjacent first pixel and the second sub-pixel corresponding to the adjacent second pixel.

The first space and the second space are configured to assist light emission of at least one of the first sub-pixel, the second sub-pixel, and the third sub-pixel.

In some embodiments, the first sub-pixel is a red sub-pixel, the second sub-pixel is a green sub-pixel, and the third sub-pixel is a blue sub-pixel, wherein the first space is configured to accommodate at least one of a cyan sub-pixel, a yellow sub-pixel, a purple sub-pixel, and a magenta sub-pixel, and wherein the second space is configured to accommodate at least one of a cyan sub-pixel, a yellow sub-pixel, a purple sub-pixel, and a magenta sub-pixel.

In some embodiments, the first space is configured to accommodate one of a cyan sub-pixel and a yellow sub-pixel arranged alternately, and the second space is configured to accommodate one of a cyan sub-pixel and a yellow sub-pixel arranged alternately.

In some embodiments, the first space is configured to accommodate one of a cyan sub-pixel and a purple sub-pixel arranged alternately, and the second space is configured to accommodate one of a cyan sub-pixel and a purple sub-pixel arranged alternately.

In some embodiments, the first space is configured to accommodate one of a purple sub-pixel and a yellow sub-pixel arranged alternately, and the second space is configured to accommodate one of a purple sub-pixel and a yellow sub-pixel arranged alternately.

In some embodiments, the first space is configured to accommodate one of a magenta sub-pixel and a yellow sub-pixel arranged alternately, and the second space is configured to accommodate one of a magenta sub-pixel and a yellow sub-pixel arranged alternately.

In some embodiments, the first space is configured to accommodate one of a purple sub-pixel, and the second space is configured to accommodate one of a cyan sub-pixel and a yellow sub-pixel arranged alternately.

In some embodiments, the first space is configured to accommodate one of a magenta sub-pixel, and the second space is configured to accommodate one of a cyan sub-pixel and a yellow sub-pixel arranged alternately.

In some embodiments, each of the first sub-pixel, the second sub-pixel, and the third sub-pixel has a regular octagonal shape.

Another embodiment of the present invention provides a display device, including a pixel structure, the pixel structure including a plurality of first pixels and a plurality of second pixels, wherein the first pixels each includes a first sub-pixel and a second sub-pixel arranged in an oblique line, and the second pixels each include the second sub-pixel and a third sub-pixel arranged in an oblique line, wherein each of the first sub-pixel, the second sub-pixel, and the third sub-pixel has an octagonal shape.

The first pixel and the second pixel are alternately arranged in a longitudinal direction, and the first pixel and the second pixel are alternately arranged in a longitudinal direction.

In the first pixels and the second pixels alternately arranged in the traverse direction, for two adjacent ones of the first pixel and the second pixel, a first space is defined between the first sub-pixel corresponding to the adjacent first pixel and the third sub-pixel corresponding to the adjacent second pixel, and a second space is defined between the second sub-pixel corresponding to the adjacent first pixel and the second sub-pixel corresponding to the adjacent second pixel.

The first space and the second space are configured to assist light emission of at least one of the first sub-pixel, the second sub-pixel, and the third sub-pixel.

In some embodiments, the first sub-pixel is a red sub-pixel, the second sub-pixel is a green sub-pixel, and the third sub-pixel is a blue sub-pixel, wherein the first space is configured to accommodate at least one of a cyan sub-pixel, a yellow sub-pixel, a purple sub-pixel, and a magenta sub-pixel, and wherein the second space is configured to accommodate at least one of a cyan sub-pixel, a yellow sub-pixel, a purple sub-pixel, and a magenta sub-pixel.

In some embodiments, the first space is configured to accommodate one of a cyan sub-pixel and a yellow sub-pixel arranged alternately, and the second space is configured to accommodate one of a cyan sub-pixel and a yellow sub-pixel arranged alternately.

In some embodiments, the first space is configured to accommodate one of a cyan sub-pixel and a purple sub-pixel arranged alternately, and the second space is configured to accommodate one of a cyan sub-pixel and a purple sub-pixel arranged alternately.

In some embodiments, the first space is configured to accommodate one of a purple sub-pixel and a yellow sub-pixel arranged alternately, and the second space is configured to accommodate one of a purple sub-pixel and a yellow sub-pixel arranged alternately.

In some embodiments, the first space is configured to accommodate one of a magenta sub-pixel and a yellow sub-pixel arranged alternately, and the second space is configured to accommodate one of a magenta sub-pixel and a yellow sub-pixel arranged alternately.

In some embodiments, the first space is configured to accommodate one of a purple sub-pixel, and the second space is configured to accommodate one of a cyan sub-pixel and a yellow sub-pixel arranged alternately.

In some embodiments, the first space is configured to accommodate one of a magenta sub-pixel, and the second space is configured to accommodate one of a cyan sub-pixel and a yellow sub-pixel arranged alternately.

In some embodiments, each of the first sub-pixel, the second sub-pixel, and the third sub-pixel has a regular octagonal shape.

In some embodiments, each of the first sub-pixel, the second sub-pixel, and the third sub-pixel has an irregular octagonal shape.

The pixel structure and the display device of the embodiments of the present invention improve the luminous efficiency of the pixel structure by arranging the first sub-pixel, the second sub-pixel, and the third sub-pixel into octagonal shapes, and effectively utilizing a space between the sub-pixels by installing a new sub-pixel to assist light emission of the pixel structure.

BRIEF DESCRIPTION OF THE SEVERAL VIEWS OF THE DRAWINGS

Other objects and aspects of the present invention will become apparent from the following descriptions of the embodiments with reference to the accompanying drawings.

DESCRIPTION OF SPECIFIC EMBODIMENTS OF THE INVENTION

Figure 1:
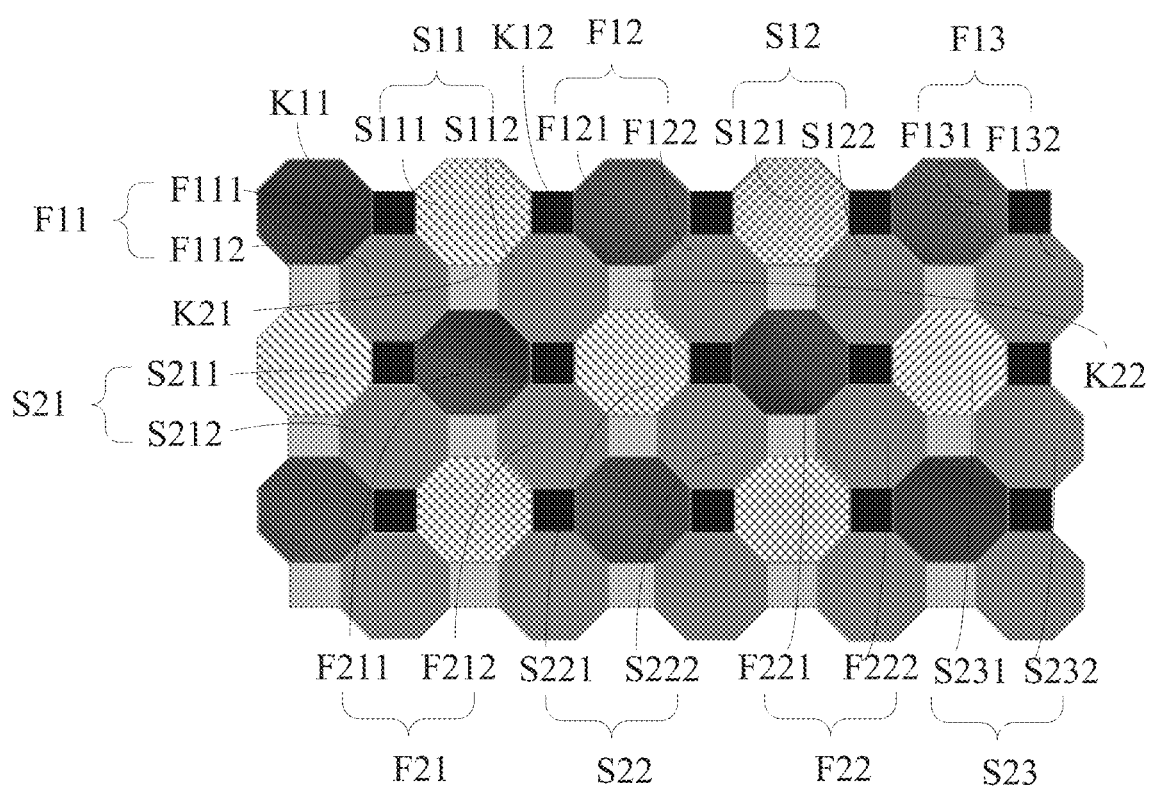
FIG. 1 is a schematic structural diagram of a pixel structure according to an embodiment of the present invention.

The following description of the various embodiments is provided to illustrate the specific embodiments of the invention. The spatially relative terms, such as "upper", "lower", "before", "after", "left", "right", "inside", "outside", "side", and the like, may be used herein for ease of description to describe one element or feature's relationship to another element(s) or feature(s) as illustrated in the figures. The spatially relative terms are intended to encompass different orientations in addition to the orientation as depicted in the figures.

In the figures, like reference numerals will be used to denote like elements.

Reference throughout this specification to "one embodiment" or "an embodiment" means that a particular feature, structure, or characteristic described in conjunction with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

An embodiment of the present invention provides a display device including a pixel structure. Please refer to FIG. 1, which is a schematic structural diagram of a pixel structure according to an embodiment of the present invention.

The pixel structure includes a plurality of first pixels and a plurality of second pixels. Specifically, as shown in FIG. 1, the pixel structure 1 includes a plurality of first pixels such as a first pixel F11, a first pixel F12, a first pixel F13, a first pixel F21, and a first pixel F22. The pixel structure 1 further includes a plurality of second pixels such as a second pixel S11, a second pixel S12, a second pixel S13, a second pixel S21, and a second pixel S22.

The first pixel includes a first sub-pixel and a second sub-pixel, and the first sub-pixel and the second sub-pixel in the first pixel are arranged in an oblique line. As shown in FIG. 1, the first pixel F11 includes a first sub-pixel F111 and a second sub-pixel F112 arranged in an oblique line, and the first pixel F12 includes a first sub-pixel F121 and a second sub-pixel F122 arranged in an oblique line.

The second pixel includes a second sub-pixel and a third sub-pixel, wherein the second sub-pixel and the third sub-pixel in the second pixel are arranged in an oblique line. As shown in FIG. 1, the second pixel S11 includes a second sub-pixel S112 and a third sub-pixel S111 arranged in an oblique line, and the second pixel S12 includes a second sub-pixel S122 and a third sub-pixel S121 arranged in an oblique line.

The first sub-pixel, the second sub-pixel, and the third sub-pixel emit light of different colors, and various desired colors can be obtained by adjusting the brightness of the three sub-pixels. In an embodiment, the first sub-pixel, the second sub-pixel, and the third sub-pixel may correspond to a red sub-pixel, a green sub-pixel, and a blue sub-pixel sequentially.

The first sub-pixel, the second sub-pixel, and the third sub-pixel may each be arranged to an octagonal shape, wherein each of the first sub-pixel, the second sub-pixel, and the third sub-pixel may have a regular octagon shape or an irregular octagonal shape.

The first pixel and the second pixel are alternately arranged in a longitudinal direction, and the first pixel and the second pixel are alternately arranged in a longitudinal direction, that is, the first pixel and the second pixel are alternately arranged both in longitudinal and traverse directions. The first pixel shares the third sub-pixel of the adjacent second pixel, and the second pixel shares the first sub-pixel of the adjacent first pixel, such that not only each pixel can emit light of various colors, but also the number of sub-pixels may be reduced.

In the first pixel and the second pixel alternately arranged in a traverse direction, for two adjacent ones of the first pixels and the second pixels, a first space is defined between the first sub-pixel corresponding to the adjacent first pixel and the third sub-pixel corresponding to the adjacent second pixel, and a second space is defined between the second sub-pixel corresponding to the adjacent first pixel and the second sub-pixel corresponding to the adjacent second pixel. As shown in FIG. 1, when the first sub-pixels such as F111, F121, and F131, the second sub-pixels such as F112, F122, S112, and S122, and the third sub-pixels such as S111 and S121 each are arranged to have a regular octagon shape, the first spaces K11, K12 and the second spaces K21, K22 each are defined to have a square shape.

As shown in FIG. 1, the first pixel F11, the second pixel S11, the first pixel F12, the second pixel S12, and the first pixel F13 are alternately arranged in the traverse direction, and the second pixel S21, the first pixel F21, the second pixel S22, the first pixel F22 and the second pixel S23 are alternately arranged in the traverse direction. That is, the first pixel and the second pixel are alternately arranged in the traverse direction. Similarly, the first pixel and the second pixel are also alternately arranged in the longitudinal direction, and details are not repeated herein for brevity.

In the first pixel and the second pixel alternately arranged in the traverse direction, as shown in FIG. 1, the first pixel F11 and the second pixel S11 are adjacent to each other, and a first space K11 is defined between the first sub-pixel F111 of the first pixel F11 and the third sub-pixel S111 of the second pixel S11, and a second space K21 is defined between the second sub-pixel F112 of the first pixel F11 and the second sub-pixel S112 of the second pixel S11. The second pixel S11 is also adjacent to the first pixel F12. A first space K12 is defined between the third sub-pixel S111 of the second pixel S11 and the first sub-pixel F121 of the first pixel F12. A second space K22 is defined between the second sub-pixel S112 of the second pixel S11 and the second sub-pixel F122 of the first pixel F12.

The first space and the second space may be reasonably utilized to assist light emission of at least one of the first sub-pixel, the second sub-pixel, and the third sub-pixel. For example, sub-pixels emitting light of other colors may be installed in the first space and the second space.

Figure 2:
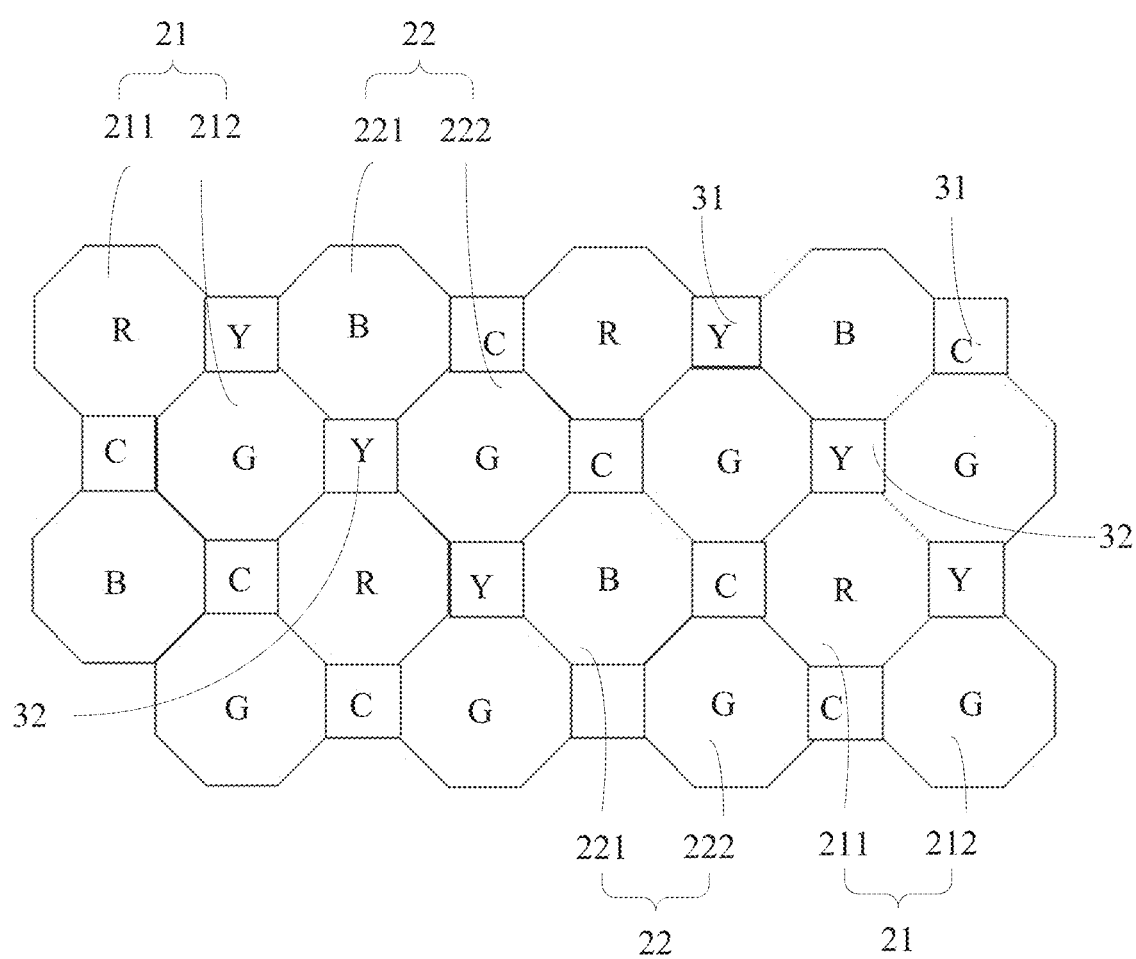
FIG. 2 is another schematic structural diagram of a pixel structure according to an embodiment of the present invention.

In some embodiments, as shown in FIG. 2, the first sub-pixel 211 may be a red sub-pixel R, the second sub-pixel 212, 222 each may be a green sub-pixel G, and the third sub-pixel 221 may be blue sub-pixel B. That is, the first pixel 21 includes a red sub-pixel R and a green sub-pixel G, and the second pixel 22 includes a blue sub-pixel B and a green sub-pixel G. The first pixel 21 shares the blue sub-pixel B of the adjacent second pixel 22, and the second pixel 22 shares the red sub-pixel R of the adjacent first pixel 21, such that not only each pixel has red, green and blue colors, but the number of sub-pixels is also reduced.

In the pixel structure 2 including the red sub-pixel R, the blue sub-pixel B, and the green sub-pixel G, the first space 31 is configured to accommodate least one of the sub-pixels of the cyan sub-pixel C, the yellow sub-pixel Y, the purple sub-pixel P, and the magenta sub-pixel M. The second space 32 is configured to accommodate at least one of the cyan sub-pixel C, the yellow sub-pixel Y, the purple sub-pixel P, and the magenta sub-pixel M. For example, the first space 31 and the second space 32 may both be configured to accommodate the cyan sub-pixel. Alternatively, the first space 31 is configured to accommodate the cyan sub-pixel, and the second space 32 is configured to accommodate the purple sub-pixel.

In an embodiment, as shown in FIG. 2, the first space 31 is configured to accommodate one of the cyan sub-pixel C and the yellow sub-pixel Y arranged alternately, and the second space 32 is configured to accommodate one of the cyan sub-pixel C and the yellow sub-pixel Y arranged alternately. As such, when a certain pixel needs to emit yellow light, the yellow sub-pixel Y around the pixel can be directly illuminated, thereby reducing the usage frequency of the red sub-pixel R and the green sub-pixel G of the pixel. When a certain pixel needs to emit cyan light, the cyan sub-pixel C around the pixel can be directly illuminated, thereby reducing the usage frequency of the blue sub-pixel B and the green sub-pixel G of the pixel.

In an embodiment, the first space 31 is configured to accommodate one of the cyan sub-pixel C and the purple sub-pixel P arranged alternately, and the second space 32 is configured to accommodate one of the cyan sub-pixel C and the purple sub-pixel P arranged alternately. Thus, when a certain pixel needs to emit cyan light, the cyan sub-pixel C around the pixel can be directly illuminated, thereby reducing the usage frequency of the blue sub-pixel B and the green sub-pixel G of the pixel. When a certain pixel needs to emit purple light, the purple sub-pixel P around the pixel can be directly illuminated, thereby reducing the usage frequency of the red sub-pixel R and the blue sub-pixel B of the pixel.

In an embodiment, the first space 31 is configured to accommodate one of the purple sub-pixel P and the yellow sub-pixel Y, and the second space 32 is configured to accommodate one of the purple sub-pixel P and the yellow sub-pixel Y arranged alternately. As such, when a certain pixel needs to emit purple light, the purple sub-pixel P around the pixel can be directly illuminated, thereby reducing the usage frequency of the red sub-pixel R and the blue sub-pixel B of the pixel. When a certain pixel needs to emit yellow light, the yellow sub-pixel Y around the pixel can be directly illuminated, thereby reducing the usage frequency of the red sub-pixel R and the green sub-pixel G of the pixel.

In an embodiment, the first space 31 is configured to accommodate one of the magenta sub-pixel M and the yellow sub-pixel Y arranged alternately, and the second space 32 is configured to accommodate one of the magenta sub-pixel M and the yellow sub-pixel Y arranged alternately. In this way, when a certain pixel needs to emit magenta light, the magenta sub-pixel M around the pixel can be directly illuminated, thereby reducing the usage frequency of the red sub-pixel R and the blue sub-pixel B of the pixel. When a certain pixel needs to emit yellow light, the yellow sub-pixel Y around the pixel can be directly illuminated, thereby reducing the usage frequency of the red sub-pixel R and the green sub-pixel G of the pixel.

Figure 3:
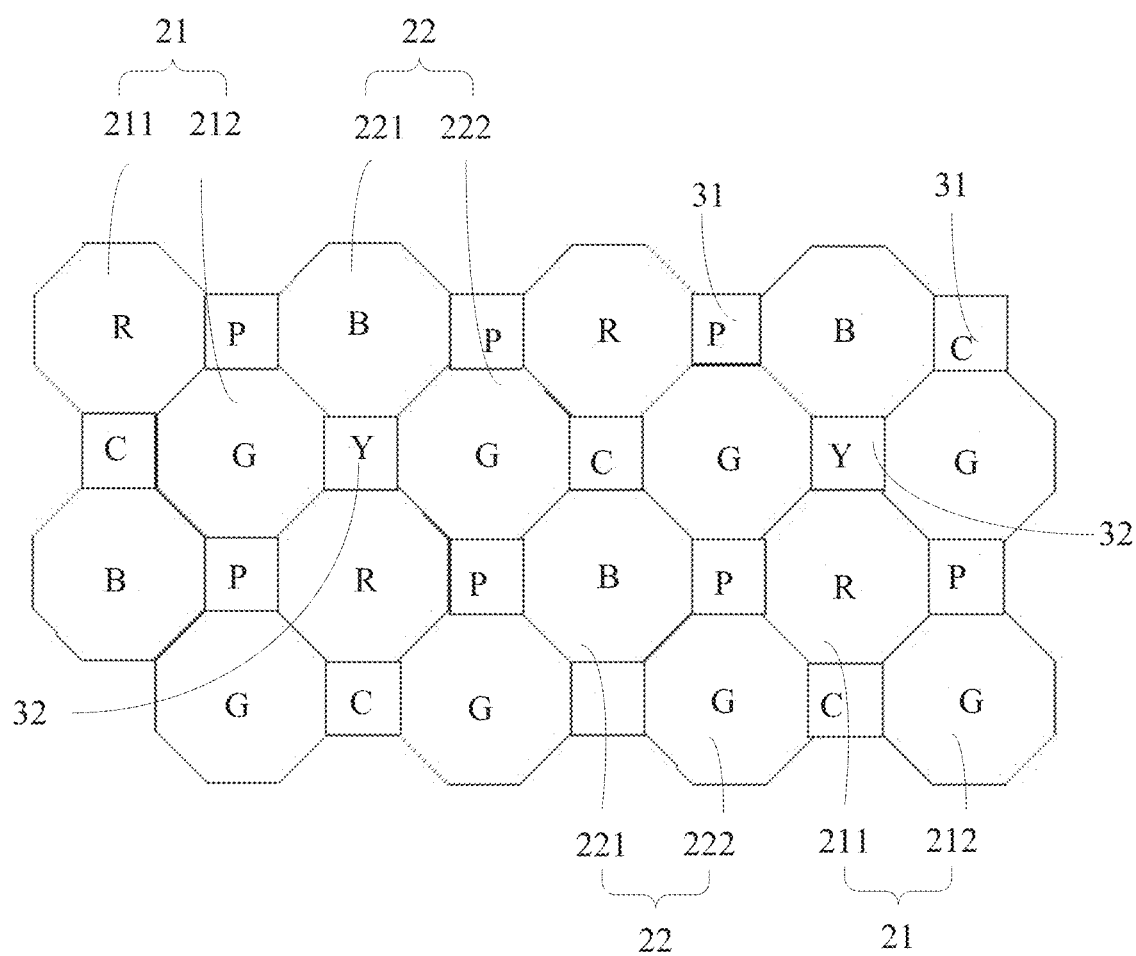
FIG. 3 is still another schematic structural diagram of a pixel structure according to an embodiment of the present invention.

In an embodiment, as shown in FIG. 3, the first space 31 is configured to accommodate the purple sub-pixel P, and the second space 32 is configured to accommodate one of the cyan sub-pixel C and the yellow sub-pixel Y arranged alternately. In this way, when a certain pixel needs to emit purple light, the purple sub-pixel P around the pixel can be directly illuminated, thereby reducing the usage frequency of the red sub-pixel R and the blue sub-pixel B of the pixel. When a certain pixel needs to emit cyan light, the cyan sub-pixel C around the pixel can be directly illuminated, thereby reducing the usage frequency of the blue sub-pixel B and the green sub-pixel G of the pixel. When a certain pixel needs to emit yellow light, the yellow sub-pixel Y around the pixel can be directly illuminated, thereby reducing the usage frequency of the red sub-pixel R and the green sub-pixel G of the pixel.

In an embodiment, the first space 31 is configured to accommodate the magenta sub-pixels M, and the second space 32 is configured to accommodate one of the cyan sub-pixels C and the yellow sub-pixels Y arranged alternately. In this way, when a certain pixel needs to emit magenta light, the magenta sub-pixel M around the pixel can be directly illuminated, thereby reducing the usage frequency of the red sub-pixel R and the blue sub-pixel B of the pixel. When a certain pixel needs to emit cyan light, the cyan sub-pixel C around the pixel can be directly illuminated, thereby reducing the usage frequency of the blue sub-pixel B and the green sub-pixel G of the pixel. When a certain pixel needs to emit yellow light, the yellow sub-pixel Y around the pixel can be directly illuminated, thereby reducing the usage frequency of the red sub-pixel R and the green sub-pixel G of the pixel.

The pixel structure and the display device of the embodiments of the present invention improve the luminous efficiency of the pixel structure by arranging the first sub-pixel, the second sub-pixel, and the third sub-pixel into octagonal shapes, and effectively utilizing a space between the sub-pixels by installing a new sub-pixel to assist light emission of the pixel structure.

In the above, the present invention has been disclosed in the above preferred embodiments, but the preferred embodiments are not intended to limit the present invention, and those skilled in the art can make various modifications without departing from the spirit and scope of the invention. The invention is modified and retouched, and the scope of the invention is defined by the scope of the claims.

What is claimed is:

1. A pixel structure, comprising a plurality of first pixels and a plurality of second pixels, wherein the first pixels each comprise a first sub-pixel and a second sub-pixel arranged in an oblique line, and the second pixels each comprise the second sub-pixel and a third sub-pixel arranged in an oblique line, wherein each of the first sub-pixel, the second sub-pixel, and the third sub-pixel has an octagonal shape; wherein:

the first pixel and the second pixel are alternately arranged in a longitudinal direction, and the first pixel and the second pixel are alternately arranged in a traverse direction;

in the first pixels and the second pixels alternately arranged in the traverse direction, for two adjacent ones of the first pixels and the second pixels, a first space is defined between the first sub-pixel corresponding to the adjacent first pixel and the third sub-pixel corresponding to the adjacent second pixel, and a second space is defined between the second sub-pixel corresponding to the adjacent first pixel and the second sub-pixel corresponding to the adjacent second pixel; and the first space and the second space are spaced apart from each other and configured to assist light emission of at least one of the first sub-pixel, the second sub-pixel, and the third sub-pixel.

2. The pixel structure of claim 1, wherein the first sub-pixel is a red sub-pixel, the second sub-pixel is a green sub-pixel, and the third sub-pixel is a blue sub-pixel, wherein the first space is configured to accommodate at least one of a cyan sub-pixel, a yellow sub-pixel, a purple sub-pixel, and a magenta sub-pixel, and wherein the second space is configured to accommodate at least one of a cyan sub-pixel, a yellow sub-pixel, a purple sub-pixel, and a magenta sub-pixel.

3. The pixel structure of claim 2, wherein the first space is configured to accommodate one of a cyan sub-pixel and a yellow sub-pixel arranged alternately, and the second space is configured to accommodate one of a cyan sub-pixel and a yellow sub-pixel arranged alternately.

4. The pixel structure of claim 2, wherein the first space is configured to accommodate one of a cyan sub-pixel and a purple sub-pixel arranged alternately, and the second space is configured to accommodate one of a cyan sub-pixel and a purple sub-pixel arranged alternately.

5. The pixel structure of claim 2, wherein the first space is configured to accommodate one of a purple sub-pixel and a yellow sub-pixel arranged alternately, and the second space is configured to accommodate one of a purple sub-pixel and a yellow sub-pixel arranged alternately.

6. The pixel structure of claim 2, wherein the first space is configured to accommodate one of a magenta sub-pixel and a yellow sub-pixel arranged alternately, and the second space is configured to accommodate one of a magenta sub-pixel and a yellow sub-pixel arranged alternately.

7. The pixel structure of claim 2, wherein the first space is configured to accommodate one of a purple sub-pixel, and the second space is configured to accommodate one of a cyan sub-pixel and a yellow sub-pixel arranged alternately.

8. The pixel structure of claim 2, wherein the first space is configured to accommodate one of a magenta sub-pixel, and the second space is configured to accommodate one of a cyan sub-pixel and a yellow sub-pixel arranged alternately.

9. The pixel structure of claim 1, wherein each of the first sub-pixel, the second sub-pixel, and the third sub-pixel has a regular octagonal shape.

10. The pixel structure of claim 1, wherein each of the first sub-pixel, the second sub-pixel, and the third sub-pixel has an irregular octagonal shape.

11. A display device, comprising a pixel structure, the pixel structure comprising a plurality of first pixels and a plurality of second pixels, wherein the first pixels each comprises a first sub-pixel and a second sub-pixel arranged in an oblique line, and the second pixels each comprise the second sub-pixel and a third sub-pixel arranged in an oblique line, wherein each of the first sub-pixel, the second sub-pixel, and the third sub-pixel has an octagonal shape; wherein:

the first pixel and the second pixel are alternately arranged in a longitudinal direction, and the first pixel and the second pixel are alternately arranged in a traverse direction;

in the first pixels and the second pixels alternately arranged in the traverse direction, for two adjacent ones of the first pixel and the second pixel, a first space is defined between the first sub-pixel corresponding to the adjacent first pixel and the third sub-pixel corresponding to the adjacent second pixel, and a second space is defined between the second sub-pixel corresponding to the adjacent first pixel and the second sub-pixel corresponding to the adjacent second pixel; and the first space and the second space are spaced apart from each other and configured to assist light emission of at least one of the first sub-pixel, the second sub-pixel, and the third sub-pixel.

12. The display device of claim 11, wherein the first sub-pixel is a red sub-pixel, the second sub-pixel is a green sub-pixel, and the third sub-pixel is a blue sub-pixel, wherein the first space is configured to accommodate at least one of a cyan sub-pixel, a yellow sub-pixel, a purple sub-pixel, and a magenta sub-pixel, and wherein the second space is configured to accommodate at least one of a cyan sub-pixel, a yellow sub-pixel, a purple sub-pixel, and a magenta sub-pixel.

13. The display device of claim 12, wherein the first space is configured to accommodate one of a cyan sub-pixel and a yellow sub-pixel arranged alternately, and the second space is configured to accommodate one of a cyan sub-pixel and a yellow sub-pixel arranged alternately.

14. The display device of claim 12, wherein the first space is configured to accommodate one of a cyan sub-pixel and a purple sub-pixel arranged alternately, and the second space is configured to accommodate one of a cyan sub-pixel and a purple sub-pixel arranged alternately.

15. The display device of claim 12, wherein the first space is configured to accommodate one of a purple sub-pixel and a yellow sub-pixel arranged alternately, and the second space is configured to accommodate one of a purple sub-pixel and a yellow sub-pixel arranged alternately.

16. The display device of claim 12, wherein the first space is configured to accommodate one of a magenta sub-pixel and a yellow sub-pixel arranged alternately, and the second space is configured to accommodate one of a magenta sub-pixel and a yellow sub-pixel arranged alternately.

17. The display device of claim 12, wherein the first space is configured to accommodate one of a purple sub-pixel, and the second space is configured to accommodate one of a cyan sub-pixel and a yellow sub-pixel arranged alternately.

18. The display device of claim 12, wherein the first space is configured to accommodate one of a magenta sub-pixel, and the second space is configured to accommodate one of a cyan sub-pixel and a yellow sub-pixel arranged alternately.

19. The display device of claim 12, wherein each of the first sub-pixel, the second sub-pixel, and the third sub-pixel has a regular octagonal shape.

20. The display device of claim 12, wherein each of the first sub-pixel, the second sub-pixel, and the third sub-pixel has an irregular octagonal shape.

* * * * *

UNITED STATES PATENT AND TRADEMARK OFFICE
CERTIFICATE OF CORRECTION

PATENT NO. : 10,879,315 B2
APPLICATION NO. : 16/347819
DATED : December 29, 2020
INVENTOR(S) : Xia Zhou et al.

Page 1 of 1

It is certified that error appears in the above-identified patent and that said Letters Patent is hereby corrected as shown below:

On the Title Page

Insert the following:
Item (30) Foreign Application Priority Data
--Aug. 30, 2018 (CN) ............................. 201811001553.3--

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*